US012652884B2

(12) United States Patent
Pernot et al.

(10) Patent No.: US 12,652,884 B2
(45) Date of Patent: Jun. 9, 2026

(54) METHOD FOR MANUFACTURING A DEVICE FOR EMITTING RADIATION

(71) Applicants:CENTRE NATIONAL DE LA RECHERCHE SCIENTIFIQUE, Paris (FR); UNIVERSITE GRENOBLE ALPES, Saint Martin d'Heres (FR); COMMISSARIAT À L'ENERGIE ATOMIQUE ET AUX ÉNERGIES ALTERNATIVES, Paris (FR)

(72) Inventors: Julien Pernot, Grenoble (FR); Gwenole Jacopin, La Tronche (FR); Bruno Daudin, Grenoble (FR)

(73) Assignees: CENTRE NATIONAL DE LA RECHERCHE SCIENTIFIQUE (CNRS), Paris (FR); UNIVERSITE GRENOBLES APLES, Saint Martin d'Heres (FR); COMMISSARIAT ÁL'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 868 days.

(21) Appl. No.: 17/996,240

(22) PCT Filed: Apr. 13, 2021

(86) PCT No.: PCT/EP2021/059580
§ 371 (c)(1),
(2) Date: Oct. 14, 2022

(87) PCT Pub. No.: WO2021/209460
PCT Pub. Date: Oct. 21, 2021

(65) Prior Publication Data
US 2023/0197885 A1     Jun. 22, 2023

(30) Foreign Application Priority Data
Apr. 15, 2020     (FR) .................................. FR2003779

(51) Int. Cl.
*H10H 20/01*     (2025.01)
*H10H 20/81*     (2025.01)

(52) U.S. Cl.
CPC .. *H10H 20/0137* (2025.01); *H10H 20/01335* (2025.01); *H10H 20/018* (2025.01); *H10H 20/81* (2025.01)

(58) Field of Classification Search
CPC ......... H10H 20/01335; H10H 20/0137; H10H 20/018; H10H 20/81; H10H 20/813; H10H 20/819; H10H 20/882
See application file for complete search history.

(56) References Cited

U.S. PATENT DOCUMENTS 8,163,581 B1     4/2012    Or-Bach
2006/0172506 A1     8/2006    Bruderl et al.
(Continued)

FOREIGN PATENT DOCUMENTS

CN     107706086 A  *  2/2018    ....... H01L 21/02428
EP     1796180 A1     6/2007

*Primary Examiner* — Matthew C Landau
*Assistant Examiner* — Dmitriy Yemelyanov
(74) *Attorney, Agent, or Firm* — WCF IP

(57)     ABSTRACT

The invention relates to a method for manufacturing a transmitter device (10) comprising the steps of:
  providing of a substrate (70) made of a semiconductor material having a first face (85) defining the substrate (70) in a direction (N) normal to the first face (85),
  implanting, through the first face (85), atoms capable of forming a weakened portion in the substrate, the substrate (70) further comprising a surface portion (92) and an internal portion (95), the weakened portion (90) separating the surface portion (92) from the internal portion (95) in the normal direction (N),
  forming, on the first face (85), a light-emitting diode (20),
  bonding a face (150) of the diode (20) to a second face (155) of a support (15), and (Continued)

Figure 1:
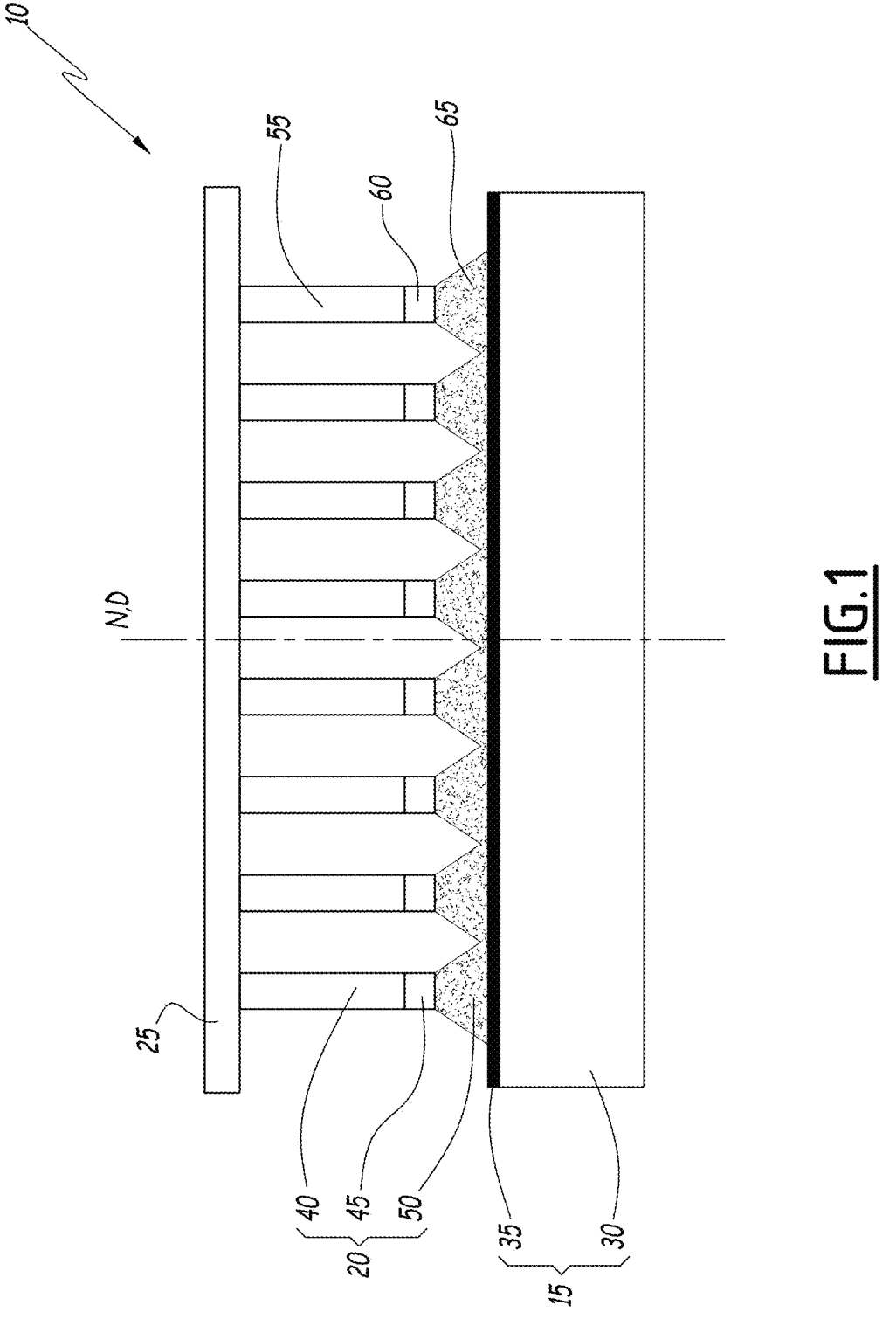

breaking the weakened portion (90) in order to separate the surface portion (92) from the internal portion (95).

9 Claims, 5 Drawing Sheets

(56) References Cited

U.S. PATENT DOCUMENTS

| | | | |
|---|---|---|---|
| 2006/0223211 A1* | 10/2006 | Mishra ................... | B82Y 10/00 |
| | | | 257/E21.132 |
| 2008/0230780 A1* | 9/2008 | Urashima ......... | H01L 21/02458 |
| | | | 438/479 |
| 2009/0117711 A1 | 5/2009 | Harle et al. | |
| 2009/0290610 A1* | 11/2009 | Eichler ................. | H01S 5/0201 |
| | | | 257/E33.044 |
| 2011/0012089 A1* | 1/2011 | Khan ................... | H10H 20/815 |
| | | | 438/47 |
| 2014/0030836 A1* | 1/2014 | Murali ............. | H01L 21/76254 |
| | | | 257/E33.013 |
| 2017/0213868 A1* | 7/2017 | Damilano ............ | H10H 29/142 |
| 2018/0158720 A1* | 6/2018 | Hu .................... | H01L 21/02631 |
| 2020/0058542 A1 | 2/2020 | Hu | |

* cited by examiner

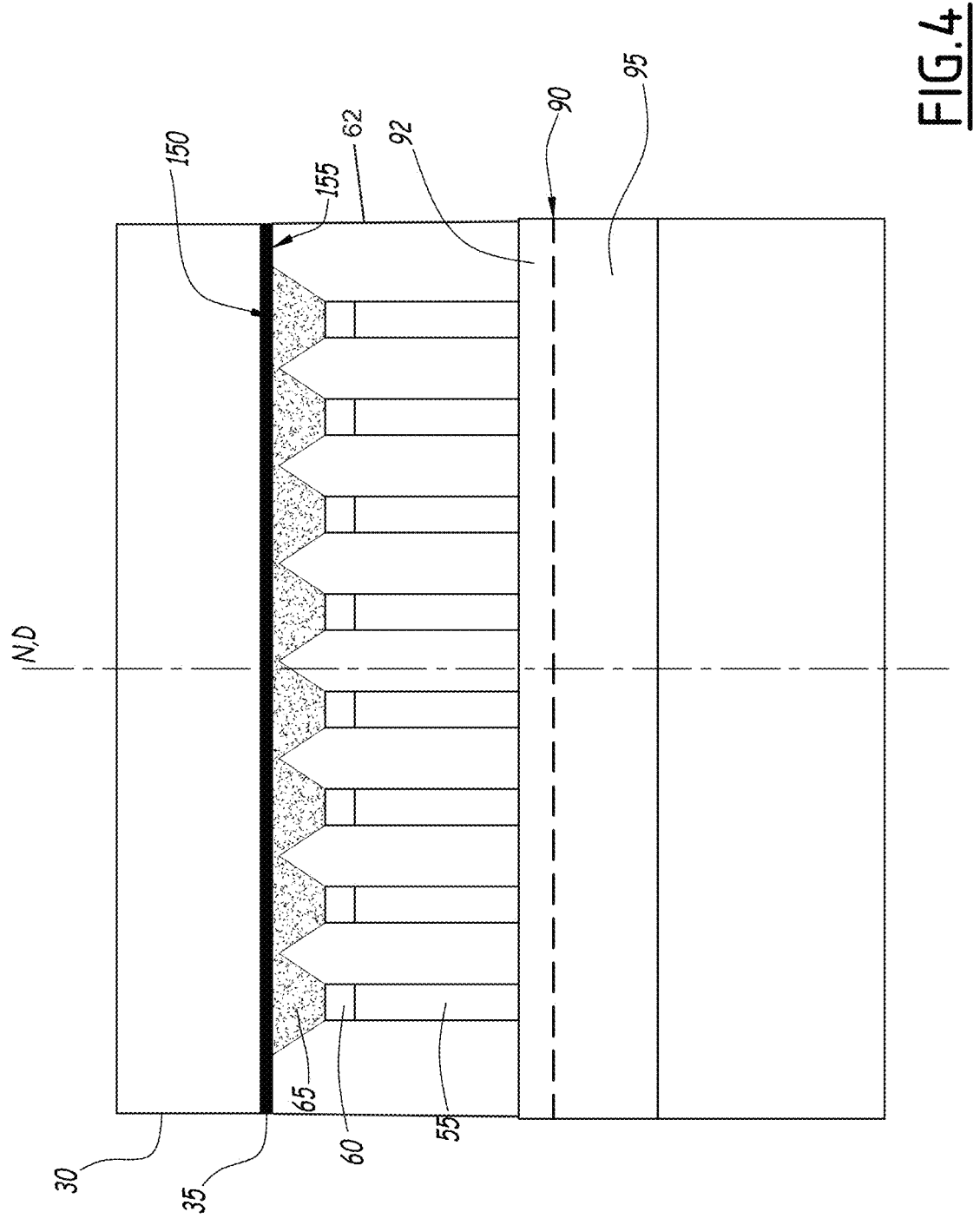
_FIG.4_

METHOD FOR MANUFACTURING A DEVICE FOR EMITTING RADIATION

The present invention relates to a method for manufacturing an emitting device.

Many emitting devices have light emitting diodes configured for emitting radiation when an electric current flows through the diodes. Such diodes comprise a p-doped portion, an n-doped portion and frequently an intermediate portion interposed between the n and p portions and intended for emitting radiation. In general, one of the n and p portions is rigidly attached to a substrate and the other p or n portion is frequently covered with a material which is transparent to the emitted radiation and is electrically conducting, serving as an electrode and/or protective layer of the light-emitting diode against mechanical or chemical aggressions and allowing radiation to be extracted from the light-emitting diode.

The light-emitting diode is generally obtained by successive deposition on the substrate of the different layers of material forming the different portions of the diode, the layer of transparent conducting material being then deposited on the light emitting diode so as to form a continuous film at least partially covering the diode. Such techniques make it possible in particular to obtain films with very small thickness, requiring little material, and, where appropriate, to structure the film e.g. by photolithography methods, in order to obtain electrodes for addressing individual zones of the diode.

A widely used example of conducting and transparent material is Indium-Tin Oxide (ITO).

It should be noted however, that conducting materials which can be deposited in thin films on light-emitting diodes are not optimized. In particular, in certain wavelength ranges such as ultraviolet, known materials such as ITO are either not transparent or are not very transparent to radiation. The result thereof is a degraded emission efficiency of the emitter, since a portion of the emitted radiation is absorbed by the ITO layer.

In other cases, a non-negligible absorption of radiation can take place at the grain boundaries between the different grains forming the film, the grain boundaries further reducing the electrical and thermal conductivity of the material. However, the deposition of known materials on a light-emitting diode tends to lead to a non-monocrystalline layer and thus has numerous grain boundaries, hence reducing the efficiency of the device.

There is thus a need for a method for manufacturing an emitting device comprising a light-emitting diode, which has a better efficiency than the emitting devices of the prior art.

To this end, a method for manufacturing an emitting device comprising a light emitting diode configured for emitting radiation, the light emitting diode including a first portion, a second portion and an emitting portion, is proposed, the first portion being made of a first semiconductor material having a first doping type, the second portion being made of a second semiconductor material having a second doping type different from the first doping type, the emitting portion being interposed between the first portion and the second portion, the emitting portion being made of a semiconductor emitting material which is configured for emitting radiation when the light emitting diode allows an electric current to pass through, the method including the steps of:

provating a substrate made at least partially of a semiconductor substrate material having the first type of doping, the substrate material being transparent to radiation, the substrate having a first face delimiting the substrate along a direction normal to the first face, implanting, through the first face, a set of atoms apt to form a weakened portion in the substrate material, the weakened portion extending parallel to the first face, the substrate further including a surface portion and an internal portion, the weakened portion separating the surface portion from the internal portion along the normal direction, forming, on the first face, the light-emitting diode by depositing at least the first material, the emitting material and the second material, the first portion being interposed along the normal direction between the emitting portion and the first face, the surface portion of the substrate being rigidly attached to the first portion, the light-emitting diode being delimited along the normal direction by the first face and by an end face of the second portion, bonding the end face to a second face of a support, the second portion being interposed along the normal direction between the support and the emitting portion, and breaking the weakened portion so as to separate the surface portion of the substrate material from the internal portion of the substrate material.

According to particular embodiments of the invention, the method includes one or a plurality of the following features, taken individually or according to all technically possible combinations:

the set of atoms implanted in the substrate so as to form a weakened portion comprises hydrogen atoms.

the substrate material being diamond.

the substrate material being aluminum nitride.

the radiation being ultraviolet radiation, in particular radiation with an average wavelength comprised between 250 nanometers and 280 nanometers.

at least one of the following properties being verified:

the first material, the second material and the third material being nitrides of [group]-III elements, and/or the substrate material being monocrystalline.

the first type of doping being a p-type doping.

the method further includes a step of providing a power supply circuit for the light emitting diode and a step of connecting the surface portion to the power supply circuit.

the light-emitting diode includes a set of nanowires each extending along the normal direction, each nanowire including a base made of the first material, an intermediate portion made of the emitting material and an end portion made of the second material, the first portion being formed by the joining of the bases of the nanowires, the emitting portion being formed by the joining of the intermediate portions, the second portion being formed by the joining of the end portions.

the method includes one of the following steps:

a step of coalescence of the end portions of the nanowires so as to form the end face, and/or a step of injection of a filler material transparent to radiation, between the nanowires, before the bonding step.

the support includes a metal portion delimited by the second face, the metal portion being bonded to the light-emitting diode during the bonding step.

An emitting device which can be obtained by a method according to any of the preceding claims, is further proposed.

Figure 2:
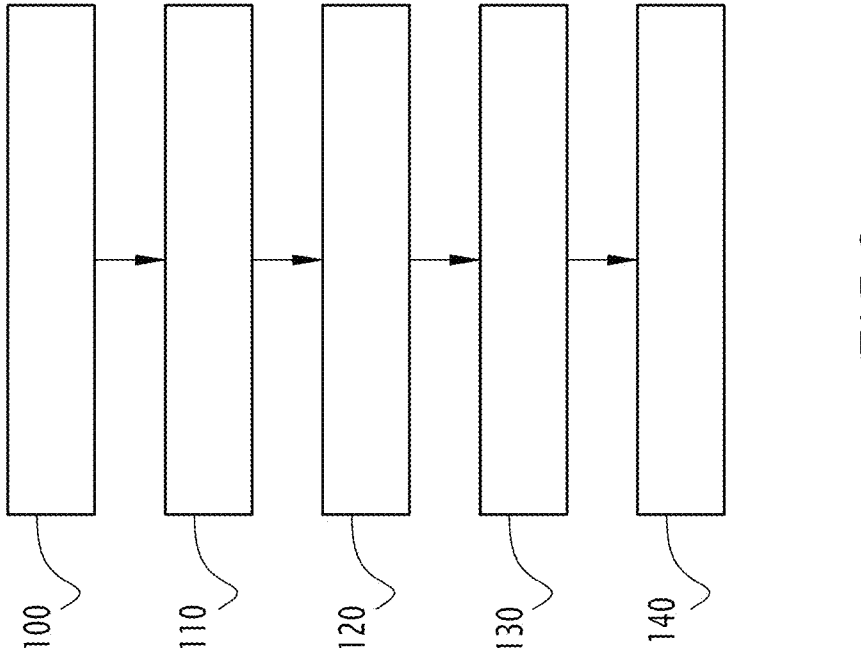
Figure 3:
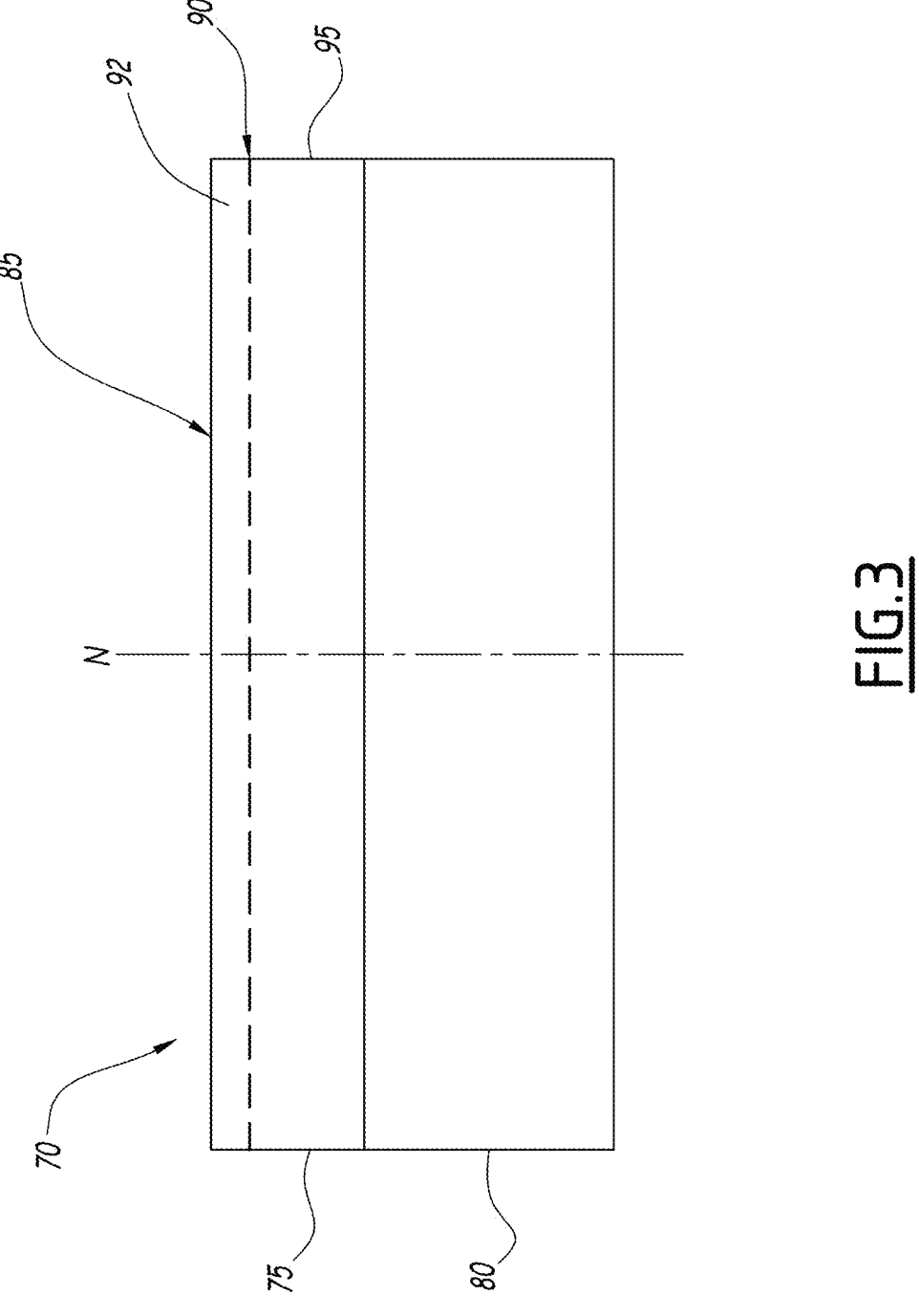
Figure 5:
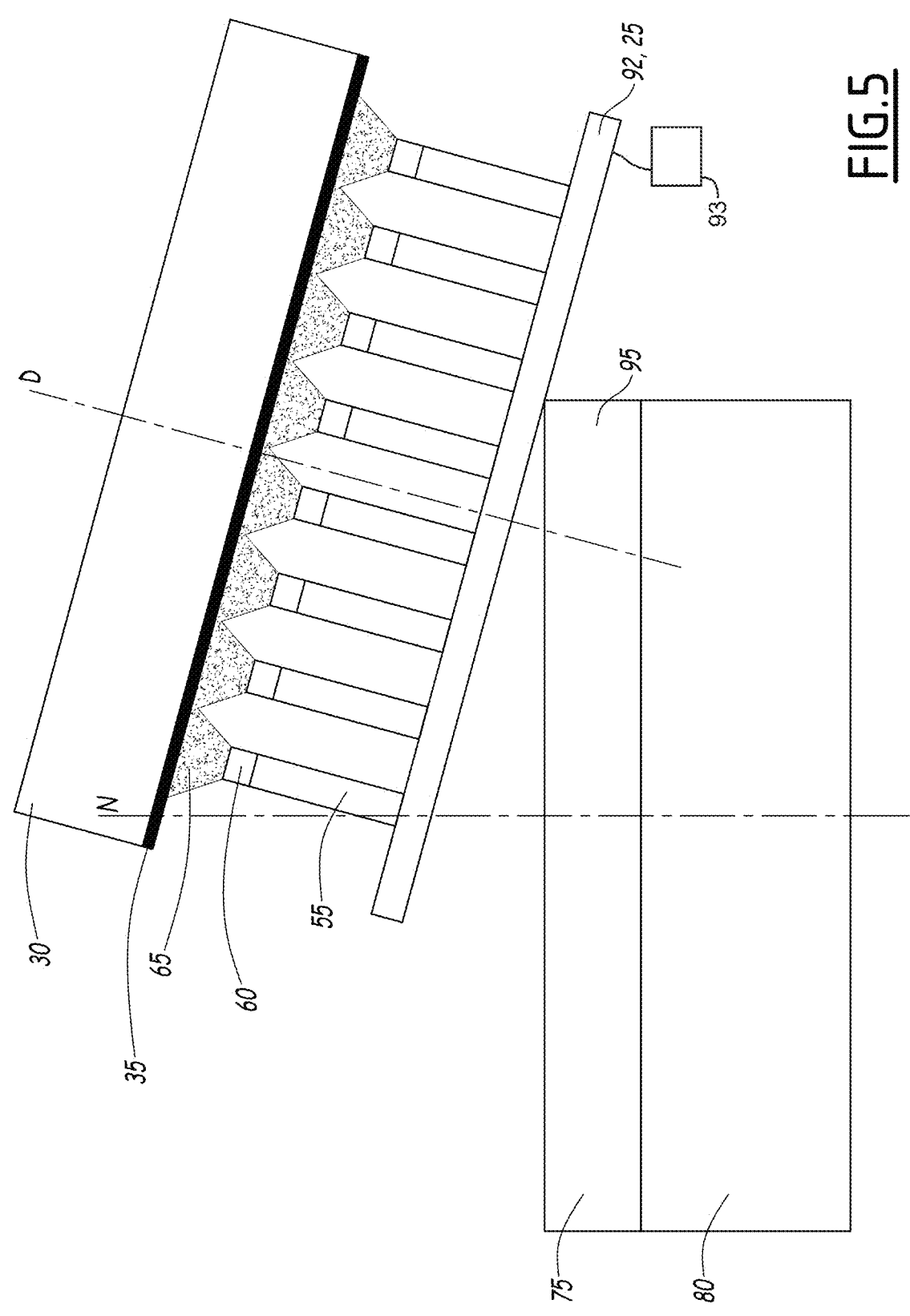

The features and advantages of the invention will appear upon reading the following description, given only as an example, but not limited to, and making reference to the enclosed drawings, wherein:

FIG. 1 is a schematic representation of the emitting device according to the invention, FIG. 2 is a flowchart of the steps of an example of a method for manufacturing an emitting device as shown in FIG. 1, FIG. 3 is a schematic view of the structure obtained during a step of the method shown in FIG. 2, FIG. 4 is a schematic representation of the structure obtained during another step of the method shown in FIG. 2, and FIG. 5 is a schematic representation of the structure obtained during yet another step of the method shown in FIG. 2.

An example of emitting device 10 is shown in FIG. 1.

The emitting device 10 is configured for emitting radiation.

All radiation comprises a set of electromagnetic waves.

A wavelength is defined for each electromagnetic wave.

Each set corresponds to a range of wavelengths. The wavelength range is the group consisting of the set of wavelengths of the set of electromagnetic waves.

An average wavelength is defined for the wavelength range.

The radiation is e.g. ultraviolet radiation. Radiation with an average wavelength comprised between 10 nanometers (nm) and 400 nm, is an example of ultraviolet radiation.

The radiation has an average wavelength comprised e.g. between 250 nm and 280 nm, e.g. equal to 265 nm.

In a variant, the radiation is e.g. visible radiation. Radiation with an average wavelength comprised between 400 nm and 800 nm is an example of visible radiation.

The emitting device 10 comprises a support 15, a light-emitting diode 20, a window layer 25 and a control circuit.

A stacking direction D is defined for the emitting device 10.

The support 15, the light-emitting diode 20 and the window layer 25 are overlaid in this order along the stacking direction D.

The support 15 is configured for supporting the light-emitting diode 20.

The support 15 includes e.g. a base 30 and a reflecting layer 35.

The base 30 is made e.g. of a metallic material such as copper.

The base 30 is e.g. a plate extending in a plane perpendicular to the stacking direction D. However, it should be noted that the shape of the base 30 is likely to vary.

The reflecting layer 35 is interposed between the base 30 and the light-emitting diode 20 in the stacking direction D.

The reflecting layer 35 is configured for reflecting radiation.

Optionally, the reflecting layer 35 is made of an electrically conducting material. According to one embodiment, the reflecting layer 35 is electrically connected to the control circuit.

The reflecting layer 35 is made e.g. of a metallic material. In particular, when the radiation is ultraviolet radiation, the reflecting layer 35 is made of aluminum.

It should be noted that in some cases the reflecting layer 35 is likely to be replaced by a metal portion of the support 15 which does not form a distinct layer from the base 30 but which is electrically conducting and/or is configured for reflecting the radiation, at least in part. In such case, the support 15 is a single-layer.

Each light emitting diode 20 is configured for emitting radiation.

Each light emitting diode 20 is a semiconductor structure comprising a plurality of semiconductor regions forming a P-N or P-I-N junction and configured for emitting light when an electric current flows through the different semiconductor regions.

In particular, each light-emitting diode 20 includes a first portion 40, an emitting portion 45 and a second portion 50.

The first portion 40, the emitting portion 45 and the second portion 50 are overlaid in this order in the stacking direction D. In particular, the emitting portion 45 is interposed between the first portion 40 and the second portion 50.

The light emitting diode is e.g. formed by one or a set of three-dimensional structures.

A three-dimensional structure is a structure which extends along a main direction. The three-dimensional structure has a length measured along the main direction. The three-dimensional structure also has a maximum lateral dimension measured along a lateral direction perpendicular to the main direction, the lateral direction being the direction perpendicular to the main direction along which the dimension of the structure is greatest.

The maximum lateral dimension is e.g. less than or equal to 10 micrometers ($\mu$m), and the length is greater than or equal to the maximum lateral dimension. The maximum lateral dimension is advantageously less than or equal to 2.5 $\mu$m.

The maximum lateral dimension is, in particular, greater than or equal to 10 nm.

In specific embodiments, the length is greater than or equal to twice the maximum lateral dimension, e.g. greater than or equal to five times the maximum lateral dimension.

The main direction is e.g. the stacking direction D. In such case, the length of the three-dimensional structure is called the "height" and the maximum dimension of the three-dimensional structure, in a plane perpendicular to the stacking direction D, is less than or equal to 10 $\mu$m.

The maximum dimension of the three-dimensional structure, in a plane perpendicular to the stacking direction D, is often referred to as a "diameter" regardless of the cross-sectional shape of the three-dimensional structure.

Each three-dimensional structure is e.g. a microwire. A microwire is a three-dimensional cylindrical structure.

In a specific embodiment, the microwire is a cylinder extending along the stacking direction D. The microwire is e.g. a cylinder with a circular base. In such case, the diameter of the base of the cylinder is less than or equal to half the length of the microwire.

A microwire with a maximum lateral dimension of less than 1 $\mu$m is called a "nanowire".

A pyramid extending along the stacking direction D from the substrate 12 is another example of a three-dimensional structure.

A cone extending along the stacking direction D is another example of a three-dimensional structure.

A truncated cone or a truncated pyramid extending along the stacking direction D is yet another example of a three-dimensional structure.

It should be noted that according to a conceivable variant, the light-emitting diode is a planar diode formed by stacking, along the stacking direction D, at least one layer of semiconductor material forming the first portion 40, at least one layer of semiconductor material forming the emitting portion 45 and at least one layer of semiconductor material forming the second portion 50, each of the layers extending in a plane perpendicular to the stacking direction D.

The first portion 40 is delimited along the stacking direction D by the emitting portion 45 and the window layer 25.

The first portion 40 is made of a first semiconductor material.

A semiconductor material is a material having a band gap value strictly greater than zero and less than or equal to 6.5 electron volts (eV).

The term "band gap value" should be understood as the band gap value between the valence band and the conduction band of the material.

Among the allowed energy bands for electrons in the material, the valence band is defined as the band which has the highest energy while being completely filled at a temperature less than or equal to 20 Kelvin (K).

A first energy level is defined for each valence band. The first energy level is the highest energy level in the valence band.

Among the allowed energy bands for electrons in the material, the conduction band is defined as the band which has the lowest energy while not being completely filled at a temperature of less than or equal to 20 K.

A second energy level is defined for each conduction band. The second energy level is the lowest energy level in the conduction band.

Thus, each band gap value is measured between the first energy level and the second energy level of the material.

A direct band gap semiconductor is an example of a semiconductor material. A material is considered to have a "direct band gap" when the minimum of the conduction band and the maximum of the valence band correspond to the same value of the momentum of charge carriers. A material is considered to have an "indirect band gap" when the minimum of the conduction band and the maximum of the valence band correspond to different values of the momentum of charge carriers.

Each semiconductor material can be chosen e.g. from the group consisting of III-V semiconductors, in particular nitrides of [group]III elements, II-VI semiconductors, or further IV-IV semiconductors.

III-V semiconductors include InAs, GaAs, AlAs and the alloys thereof, InP, GaP, AlP and the alloys thereof, and nitrides of [group-]III elements, which are AlN, GaN, InN and the alloys thereof such as AlGaN or InGaN.

II-VI semiconductors include CdTe, HgTe, CdSe, HgSe, and the alloys thereof.

IV-IV semiconductors include diamond, Si, Ge and the alloys thereof.

The first semiconductor material is e.g. AlN or AlGaN, in particular when the radiation is ultraviolet radiation.

In a variant, the first semiconductor material is e.g. GaN, or a III-V semiconductor.

The first material has a doping of a first type.

The first type of doping is chosen from the p-type doping and the n-type doping e.g. the first type of doping is the p-type doping.

Doping is defined as the presence, in a material, of impurities providing free charge carriers. Impurities are e.g. atoms of an element which is not naturally present in the material.

When impurities increase the density of holes in the material, compared to the undoped material, the doping is p-type. E.g. a layer of gallium nitride, GaN, or of gallium aluminum nitride, AlGaN, is p-doped by adding magnesium atoms (Mg).

When the first semiconductor material is AlN, p-type doping is e.g. obtained by adding indium In and magnesium Mg atoms.

When the impurities increase the volume density of free electrons in the material, compared to the undoped material, the doping is n-type e.g. a layer of gallium nitride, GaN, is n-doped by adding silicon (Si) atoms.

A thickness of the first portion 40, measured along the stacking direction D, is comprised e.g. between 50 nm and 5 μm.

Optionally, the first portion 40 includes a p-doped electron blocking layer made of a semiconductor material having a band gap strictly greater than the band gap of the second material. The electron blocking layer is e.g. made of AlGaN. The electron blocking layer is, in particular, delimited along the stacking direction D by the emitting portion 45.

The emitting portion 45 is configured for emitting radiation when an electric current passes through the light-emitting diode 20.

The emitting portion 45 is made of an emitting material. The emitting material is a semiconductor material. In particular, the emitting material has a band gap value strictly less than the band gap value of the first semiconductor material. E.g. when the first material is AlN, the emitting semiconductor material being AlGaN.

Optionally, the emitting portion 45 comprises a quantum well or a set of quantum wells.

A quantum well is a structure wherein quantum confinement occurs, in one direction, for at least one type of charge carrier. The effects of quantum confinement occur when the size of the structure along such direction becomes comparable to or smaller than the "de Broglie wavelength" of the carriers, which are usually electrons and/or holes, leading to energy levels called "energy sub-bands".

In such a quantum well, carriers can only have discrete energy values but are generally apt to move within a plane perpendicular to the direction wherein the confinement occurs. The energy values available for carriers, also known as "energy levels", increase as the quantum well dimensions decrease along the direction wherein the confinement occurs.

In quantum mechanics, the "de Broglie wavelength" is the wavelength of a particle when the particle is considered a wave. The de Broglie wavelength of electrons is also called "electron wavelength". The de Broglie wavelength of a charge carrier depends on the material of which the quantum well is made.

An emitting layer the thickness of which is strictly less than the product between the electron wavelength of the electrons in the semiconductor material forming the emitting layer, and five, is an example of a quantum well.

Another example of a quantum well is an emitting layer the thickness of which is strictly less than the product of the de Broglie wavelength of excitons in the semiconductor forming the emitting layer, and five. An exciton is a quasi-particle comprising an electron and a hole.

In particular, a quantum well often has a thickness comprised between 1 nm and 200 nm.

The quantum well or wells consist e.g. of a layer of emitting material interposed between two layers of a material, e.g. of the first semiconductor material, having a band gap value strictly greater than the band gap of the emitting material.

E.g. the emitting portion 45 includes one or a plurality of layers of the emitting material, in particular AlGaN, interposed between layers of AlN or AlGaN with a higher aluminum concentration than the emitting material.

Alternatively, when the radiation is visible radiation, the emitting material is InGaN, and the InGaN layer(s) is (are) interposed between GaN layers.

The emitting portion 45 is e.g. undoped. However, according to conceivable variants, the emitting portion 45 is likely to have the first or the second type of doping.

According to one embodiment, the emitting material forming the quantum well(s) is undoped, and the material forming the layers enclosing the emitting material has a doping of the first or second type.

The second portion 50 is interposed between the emitting portion 45 and the support 15, in particular between the emitting portion 45 and the reflecting layer 35.

The second portion 50 is made of a second semiconductor material.

The second semiconductor material has a band gap value which is strictly greater than the band gap value of the emitting material. E.g. the second semiconductor material is identical to the first material, apart from the type of doping. In particular, the second semiconductor material is AlN. In a variant, the second material is AlGaN, or GaN.

The second semiconductor material has a second doping type different from the first type of doping. The second type of doping is chosen from the n-type doping and the p-type doping. e.g. the second type of doping is the n-type doping The second portion 50 has a thickness, measured along the stacking direction D, comprised e.g. between 50 nm and 1 μm.

When the light-emitting diode 20 includes a set of three-dimensional structures, the light-emitting diode 20 is e.g. formed by the joining of a set of elementary light-emitting diodes, each elementary light-emitting diode including a three-dimensional structure, a part of which forms a part of the first portion 40, another part forms a part of the emitting portion 45 and a part forms a part of the second portion 50.

Each elementary light-emitting diode is e.g. a nanowire including a primary portion 55 (or "base"), an intermediate portion 60 and a secondary portion 65 (or "end portion"), which are overlaid in this order along the stacking direction D.

The primary portion 55 is delimited along the stacking direction D by the window layer 25 and by the intermediate portion 60. The primary portion 55 is made of the first semiconductor material.

The first portion 40 is formed by all the primary portions 55 of the different elementary light-emitting diodes.

Each primary portion 55 extends along the stacking direction D.

Each primary portion 55 is e.g. cylindrical. "Cylindrical" refers to the fact that each primary portion 55 has a uniform cross-section in any plane perpendicular to the stacking direction D. The cross-section is e.g. circular or even hexagonal.

The primary portions 55 are e.g. separated from one another. In particular, each primary portion 55 is distant from the other primary portions 55.

The intermediate portion 60 is delimited along the stacking direction D by the primary portion 55 and the secondary portion 65. The intermediate portion 60 is made of the semiconductor emitting material.

The emitting portion 45 is formed by all the intermediate portions 60 of the different elementary light-emitting diodes.

Each intermediate portion 60 is e.g. cylindrical. The section of the intermediate portion 60 in a plane perpendicular to the stacking direction D is e.g. circular or hexagonal.

The intermediate portions 60 are e.g. separated from one another. In particular, each intermediate portion 60 is distant from the other intermediate portions 60.

The secondary portion 65 is delimited along the stacking direction D by the intermediate portion 60 and by the support 15, in particular by the reflecting layer 35. The secondary portion 65 is made of the second semiconductor material.

The second portion 50 is formed by all the secondary portions 65 of the different elementary light-emitting diodes.

Each secondary portion 65 is e.g. cylindrical. The section of the secondary portion 65 in a plane perpendicular to the stacking direction D is e.g. circular or hexagonal.

In a variant, as can be seen in FIG. 1, each secondary portion 65 is conical or pyramidal. In particular, a dimension of the secondary portion 65 in a plane perpendicular to the stacking direction 65 increases when moving away from the intermediate portion 60. In particular, the secondary portions 65 of the different elementary light-emitting diodes are rigidly attached to one another and have a material continuity with one another.

The window layer 25 is designed for letting the radiation through. Furthermore, the window layer 25 is electrically conducting.

The window layer 25 is, in particular, monocrystalline. In a variant, the window layer is polycrystalline or nanocrystalline, i.e. consisting of multiple crystals, each crystal having nanometric dimensions.

The window layer 25 is made of a semiconductor material, hereinafter referred to as a substrate material.

The substrate material is transparent to radiation. In particular, the substrate material has a band gap value strictly greater than the band gap value of the emitting material. Optionally, the substrate material has a band gap value strictly greater than the band gap value of the first material.

The substrate material is e.g. diamond. In a variant, the substrate material is AlN.

The substrate material has a doping of the first type.

A resistivity of the substrate material is comprised e.g. between $10^{-3}$ Ohm-centimeter ($\Omega \cdot cm$) and $10^{-4}$ $\Omega \cdot cm$.

The window layer 25 has a thickness, measured along the stacking direction D, comprised between 10 nm and 1 μm.

The window layer 25 is e.g. electrically connected to the control circuit.

The control circuit is configured for generating an electric current flowing through the light-emitting diode 20. In particular, the electric current flows successively through the reflecting layer 35, the light-emitting diode 20 and the window layer 25.

The electric current is suitable for triggering the emission of radiation by the light-emitting diode 20 when the electric current flows through the light-emitting diode 20.

A method for manufacturing the emitting device 10 will now be described with reference to FIG. 2, which presents a flow chart of the steps of such method.

The manufacturing method includes a provision step 100, an implantation step 110, a formation step 120, a bonding step 130 and a breaking step 140.

During the provision step 100, a substrate 70 is provided. The substrate 70 can be seen, in particular, in FIG. 3.

The substrate 70 is made at least partially of the substrate material. In particular, the substrate 70 includes at least one portion 75 made of the substrate material.

The portion 75 is e.g. a layer of substrate material borne by a wafer 80 serving as a support for the layer.

The layer 75 of substrate material is e.g. borne by a plate 80 made of the same material as the substrate material, the plate 80 differing in that the material of the plate 80 is undoped or has less doping than the substrate material. In particular, the plate 80 is made of undoped or lightly doped diamond.

In a variant, the substrate 70 is made entirely of the substrate material. In such case, the portion 75 forms the entire substrate 70.

The portion 75 is e. g. monocrystalline. E.g. the layer 75 and the plate 80 are each monocrystalline.

According to one embodiment, the substrate 70 is monocrystalline.

The substrate has a first face 85.

The first face 85 is e.g. plane.

The first face 85 delimits the substrate 70, in particular the portion 75 of substrate material, along a direction N normal to the first face 85. In particular, the layer 75 extends in a plane perpendicular to the normal direction N.

According to one embodiment, the first face 85 comprises a mask, i.e. a layer partially covering the first face 85. In particular, the mask is made of a material preventing the deposition of the first material on the mask, so that, as will become apparent hereinafter, the deposition of the first material takes place only on the portions of the first face 85 which are not covered by a mask. The mask is e.g. made of titanium nitride TiN, or else of silicon nitride ($Si_xN_y$), $TiO_2$, $SiO_2$ or graphene.

During the implantation step 110, a set of atoms is implanted in the substrate material.

"Implanting" refers in particular to the fact that atoms or ions are accelerated, e.g. by an electric or magnetic field, and propelled toward the substrate 70, in particular toward the first face 85, so that the atoms are buried in the substrate 70.

Atoms are e.g. hydrogen atoms. However, other types of atoms can be used. The surface density of hydrogen atoms is comprised e.g. between $10^{15}$ and $10^{18}$ $cm^{-2}$. The implantation depth is comprised e.g. between 10 nm and 1 μm.

The atoms are, in particular, implanted in the substrate material through the first face 85.

At the end of the implantation step 110, a weakened portion 90, a surface portion 92 and an internal portion 95 are obtained in the substrate material, in particular in the portion 75.

The portion of substrate material 75 is formed by the joining of the weakened portion 90, the surface portion 92 and the internal portion 95.

The weakened portion 90 is the portion of the substrate material 75 wherein the implanted atoms are present.

The weakened portion 90 extends parallel to the first face 85, hence in a plane perpendicular to the normal direction N.

Indeed, if the implanted atoms are projected, during the implantation step 110, onto the first face 85, with an identical speed for all of the atoms, the depth at which each atom is implanted, measured along the normal direction N from the first face 85, is the same for all atoms. Thus, a weakened portion 90 extending parallel to the first face 85 is obtained.

The depth of implantation of the atoms is comprised between 10 nm and 1 μm. In particular, the depth of implantation is equal to the expected thickness of the window layer 25 at the end of the manufacturing process.

The weakened portion 90 separates the surface portion 92 from the internal portion 95.

The surface portion 92 is interposed along the normal direction N between the weakened portion 90 and the internal portion 95. In other words, the internal portion 95 is formed by all of the portions of substrate material which are located at a depth, with respect to the first face 85, strictly greater than the depth of implantation of the atoms.

During the formation step 120, the light-emitting diode 20 is formed on the first face 85. In particular, the first material, the emitting material and the second material are deposited in this order on the first face 85 so as to obtain the light-emitting diode 20.

The light-emitting diode 20 is e.g. formed by chemical vapor deposition (CVD), or by molecular beam epitaxy.

At the end of the formation step 120, the stacking direction D of the light-emitting diode 20 is merged with the normal direction N.

At the end of the formation step 120, the light-emitting diode 20 is delimited by the first face 85 and by an end face 150 of the light-emitting diode.

The first portion 40 is interposed between the first face 85 and the emitting portion 45 along the normal direction N.

The first portion 40 is, in particular, delimited along the normal direction N by the first face 85 and by the emitting portion 45. In particular, the first portion 40 is rigidly attached to the surface portion 92.

E.g. the first portion grows epitaxially on the first face 85.

In a manner known per se, the three-dimensional structures forming the light-emitting diode are obtained by depositing the first material on the portions of the first face 85 which have no mask, the first material not being deposited on the mask. Thus, primary portions 55 separated from one another and extending along the normal direction N are obtained.

In a variant, the deposition conditions, in particular temperature conditions during the formation step 120, are chosen so that the growth of the first material naturally takes place in the form of columns which are separated from one another.

Once the first portion 40 has been formed, the emitting portion 45 and the second portion 50 are deposited on the columns forming the first portion 40, and naturally tend to keep a three-dimensional growth.

Optionally, the formation step 120 includes a step of coalescence of the secondary portions 65 forming the second portion 50. The conditions e.g., in particular the temperature of the substrate 70 during the deposition of the second material, are chosen so that the lateral dimension of the secondary portions 65 increases when moving away from the intermediate portions 60 until the secondary portions 65 come into contact with each other and then merge to form a second one-piece portion 50.

In a variant or in addition, the formation step 120 includes a planarization step.

The planarization step involves injecting a filler material 62 into the space between the nanostructures, especially the nanowires which form the light-emitting diode.

The filler material 62 is transparent to radiation. Furthermore, the filler material 62 is electrically insulating. The filler material 62 is e.g. alumina $Al_2O_3$.

After injection and/or coalescence, the end face 150 of the light-emitting diode 20 is planarized, e.g. by mechanical or chemical-mechanical polishing. In fact, the end face 150 is likely to have, after the deposition of the second material, excessive roughness, in particular when the light-emitting diode 20 includes a set of three-dimensional structures, since the height of the structures is likely to vary from one structure to another due to variations in the diameter of the structures or to local variations in the density of structures.

During the bonding step 130, the end face 150 of the light-emitting diode 20 is bonded to a face, called the second face 155, of the support 15, as shown in FIG. 4. In particular, the second face 155 is a face delimiting the reflecting layer 35 along the stacking direction D.

In the case of a two-layer support 15, the faces 150 and 155 are e.g. bonded to each other by depositing a metal layer, e.g. a layer of aluminum (e.g. by evaporation or by electron beam physical vapor deposition) on the face 150, then by welding the support 15 to the aluminum layer, e.g. using a brazing metal interposed between the support 15 and the face 150.

During the breaking step 140, the weakened portion 90 is broken so as to separate the surface portion 92 from the internal portion 95. Thus, the surface portion 92, separated from the rest of the substrate 70 and rigidly attached to the first portion 40 of the light-emitting diode, forms the window layer 25. The breaking of the weakened portion 90 can be seen in particular in FIG. 5.

The weakened portion 90 is e.g. broken by heating the substrate 70 to a temperature and for a period of time suitable for triggering the formation, in the weakened portion 90, of bubbles of a gas formed by the implanted atoms. The bubbles formed thus trigger the breaking of the weakened portion 90 and the separation of the portion 75 of the substrate material along the weakened portion 90.

Furthermore, at the end of the breaking step 140, the control circuit 93 is electrically connected to the surface portion 92, forming the window layer 25, and/or to the reflecting layer 25.

By using the invention, a window layer 25 which is transparent to radiation, is easily obtained. In particular, such window layer can be made of a material which is not suitable for deposition on the light-emitting diode 20, e.g. of a material, the deposition of which is carried out at temperatures likely to damage the light-emitting diode 20. The widest variety of materials thus makes it possible in particular, to use substrate materials, such as diamond, which are both conducting and transparent to radiation.

Moreover, the same substrate 70 can be used a large number of times, a small thickness of substrate material (forming the surface portion 92) being removed each time. Thus, the same substrate 70 can be used for the growth of many diodes 20 and for the manufacture of many emitting devices 10, which is particularly advantageous in the case of substrates 70 which are difficult to obtain, e.g. in the case of substrates 70 made of AlN or AlN on silicon.

Moreover, the breaking of the weakened portion 90 generates a surface roughness of the face of the window layer 25 which is opposite to the light-emitting diode 20, i.e. the face through which the radiation is expected to leave the window layer 25. Such roughness facilitates the extraction of the radiation from the window layer 25 and thus increases the efficiency of the device 10.

A characteristic length of the roughness is comprised e.g. between 0.1 and 30 times a ratio between, in the numerator, the mean wavelength of the radiation and, in the denominator [ERROR IN THE ORIGINAL: NUMERATOR], the optical index at that wavelength of the material forming the window layer 25, such range of characteristic lengths being used for a good extraction of the radiation.

Furthermore, the window layer 25 is likely to be monocrystalline if the substrate 70 used comprises a monocrystalline portion 75. The transparency and/or the electrical conductivity of the window layer 25 are thus improved compared with polycrystalline window layers 25.

Diamond is in particular a material transparent over a wide range of wavelengths and apt to be conducting, especially when heavily p-doped. Diamond is in particular suitable for the growth of nitrides of [group-]III elements, and transparent to radiation, in particular UV radiation, obtained by the diodes made of such materials.

Furthermore, the p-doping of nitrides of [group-]III elements and in particular of AlN is difficult and hence it is particularly advantageous to use p-doped diamond as a window layer for limiting the use of nitrides of [group-]III elements and in particular of p-doped AlN with low conductivity.

Three-dimensional structures, and in particular nanowires of nitrides of [group-]III elements and in particular AlN nanowires, make possible a more efficient p doping than two-dimensional structures.

Coalescence and/or injection of filling material 62, followed by polishing, make it possible to obtain flat faces 150 and are used for good bonding to the reflecting layer 35. In particular, the injection of filler material 62 prevents excessive damage to three- dimensional structures during polishing.

The metal portion 35 of the support 15 makes it possible to reflect the radiation and thus to increase the output efficiency of the emitting device 10. Furthermore, the layer 35 can be used for an easy electrical supply of the diode 20.

It should be noted that according to the embodiments envisaged, the emitting device 10 further includes a converter (sometimes called "phosphorus") configured for absorbing all or part of the radiation and for emitting in response, radiation having a different mean wavelength, in particular strictly longer, than the average wavelength of the emitted radiation. The converter is then e.g. placed in contact with the window layer 25, the window layer 25 being in particular interposed between the converter and the light-emitting diode 20.

Although the specific case wherein the substrate material is diamond and the first type of doping is p-doping, as described in detail above, other configurations are possible, in particular, configurations wherein the first doping type is n doping and the second doping type is p doping.

E.g. the first type of doping is n-doping, the substrate material is AlN, n-doped, and the second material is e.g. p-doped AlGaN. Such configurations include e.g. planar light-emitting diodes 20, although configurations wherein the light-emitting diodes 20 include three-dimensional structures are also conceivable.

When the first type of doping is n doping, the electron blocking layer is e.g. a part of the second portion 50.

e.g. if the substrate is p-doped diamond or p-doped AlN, the first portion 40 is made of a nitride of a [group-]III element having a p-type doping, the second portion 50 is made of a material having an n-type doping, the emitting portion 45 being interposed between the portions 40 and 50 and having an n-type or a p-type doping, or being unintentionally doped.

When the substrate is n-doped AlN, the first portion 40 is e.g. made of a [group-]III element nitride having an-type doping, the second portion 50 is made of a material having a p-type doping, the emitting portion 45 being interposed between the portions 40 and 50 and having an n-type or a p-type doping, or being unintentionally doped.

The invention claimed is:

1. A method for manufacturing an emitting device comprising a light emitting diode configured for emitting radiation, the light emitting diode including a first portion, a second portion and an emitting portion, the first portion being made of a first semiconductor material having a first doping type, the second portion being made of a second semiconductor material having a second doping type different from the first doping type, the emitting portion being interposed between the first portion and the second portion, the emitting portion being made of a semiconductor emitting material which is configured for emitting radiation upon passage of an electric current, wherein the first semiconductor material, the second semiconductor material and the semiconductor emitting material are nitrides of group III elements, the method including the steps of:

providing a substrate made at least partially of a semiconductor substrate material having the first doping type, wherein the semiconductor substrate material is crystalline diamond and the first doping type is p-type doping, the substrate material being transparent to radiation, the substrate having a first face delimiting the substrate along a direction normal to the first face, implanting through the first face a set of atoms able to form a weakened portion in the substrate material, the weakened portion extending parallel to the first face, the substrate further including a surface portion and an internal portion, the weakened portion separating the surface portion from the internal portion along the normal direction, formation on the first face of the light-emitting diode by depositing at least the first material, the emitting material and the second material, the first portion being interposed along the normal direction between the emitting portion and the first face, the surface portion of the substrate being rigidly attached to the first portion, the light-emitting diode being delimited along the normal direction by the first face and by an end face of the second portion, bonding the end face to a second face of a support, the second portion being interposed along the normal direction between the support and the emitting portion, and breaking the weakened portion so as to separate the surface portion of the substrate material from the internal portion of the substrate material.

2. The method according to claim 1, wherein the set of atoms implanted in the substrate so as to form a weakened portion comprises hydrogen atoms.

3. The method according to claim 1, wherein the radiation is ultraviolet radiation.

4. The method according to claim 1, wherein the substrate material is monocrystalline.

5. The method according to claim 1, further comprising a step of providing a power supply circuit for the light emitting diode and a step of connecting the surface portion to the power supply circuit.

6. The method according to claim 1, wherein the light emitting diode includes a set of nanowires each extending along the normal direction, each nanowire having a base made of the first material, an intermediate portion made of the emitting material and an end portion made of the second material, the first portion being formed by joining the bases of the nanowires, the emitting portion being formed by joining the intermediate portions, the second portion being formed by joining the end portions.

7. The method according to claim 6, including one of the following steps:

-a step of coalescence of the end portions of the nanowires so as to form the end face, and/or - a step of injection of a filler material transparent to radiation, between the nanowires, prior to the bonding step.

8. The method according to claim 1, wherein the support includes a metal portion delimited by the second face, the metal portion being bonded to the light emitting diode during the bonding step.

9. An emitting device which can be obtained by a method according to claim 1, comprising a first portion, a second portion and an emitting portion, the first portion being made of a first semiconductor material having a first doping type, the second portion being made of a second semiconductor material having a second doping type different from the first doping type, the emitting portion being interposed between the first portion and the second portion, the emitting portion being made of a semiconductor emitting material which is configured for emitting radiation upon the passage of an electric current, wherein the first semiconductor material, the second semiconductor material and the semiconductor emitting material are nitrides of group-III elements, and a surface portion forming a window layer, transparent to radiation and made at least partially of a semiconductor material having the first doping type, wherein the semiconductor material is crystalline diamond and the first doping type is p-type doping, the first portion being interposed between the surface portion and the emitting portion.

\* \* \* \* \*